United States Patent
Kim et al.

(10) Patent No.: US 8,183,762 B2
(45) Date of Patent: May 22, 2012

(54) ORGANIC ELECTROLUMINESCENT DISPLAY DEVICE AND METHOD OF FABRICATING THE SAME

(75) Inventors: Young-Mi Kim, Incheon (KR); Hyun-Taek Lim, Busan (KR); Jong-Hyun Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 763 days.

(21) Appl. No.: 11/945,817

(22) Filed: Nov. 27, 2007

(65) Prior Publication Data

US 2008/0122349 A1 May 29, 2008

(30) Foreign Application Priority Data

Nov. 28, 2006 (KR) .................. 10-2006-0118600

(51) Int. Cl.
*H01J 1/62* (2006.01)
*H01J 63/04* (2006.01)
(52) U.S. Cl. .......... 313/504; 313/505; 313/506; 445/24
(58) Field of Classification Search .......... 313/504–506; 445/24
See application file for complete search history.

(56) References Cited

U.S. PATENT DOCUMENTS

| | | | |
|---|---|---|---|
| 2002/0086180 A1* | 7/2002 | Seo et al. | 428/690 |
| 2006/0292394 A1* | 12/2006 | Iwaki et al. | 428/690 |
| 2007/0049778 A1* | 3/2007 | Nomura et al. | 585/26 |

* cited by examiner

*Primary Examiner* — Peter Macchiarolo
*Assistant Examiner* — Thomas A Hollweg
(74) *Attorney, Agent, or Firm* — Birch, Stewart, Kolasch & Birch, LLP

(57) ABSTRACT

An organic electroluminescent display (OELD) device includes first and second substrates facing each other, a plurality of gate lines, a plurality of data lines and a plurality of power lines on the first substrate, the gate and data lines crossing each other to define a plurality of pixel regions, a switching element and a driving element connected to each other in each pixel region, a first electrode connected to the driving element, an organic luminescent layer on the first electrode, and a second electrode on the organic luminescent layer. The organic luminescent layer includes a hole injection layer, a hole transporting layer, an emission material layer, an electron transporting layer, and an electron injection layer in order. Further, the hole injection layer includes a crystallizable hole injection material and a hole transporting material, and the hole transporting layer includes the hole transporting material.

17 Claims, 13 Drawing Sheets

ORGANIC ELECTROLUMINESCENT DISPLAY DEVICE AND METHOD OF FABRICATING THE SAME

The present application claims the benefit of Korean Patent Application No. 2006-0118600 filed in Korea on Nov. 28, 2006, which is hereby incorporated by reference for all purposes as if fully set forth herein.

BACKGROUND OF THE INVENTION

1. Field of the Invention

The present invention relates to an organic electroluminescent display (OELD) device, and more particularly, to an OELD device including a hole injection layer having an improved properties and method for fabricating the same.

2. Discussion of the Related Art

In general, organic electroluminescent display (OELD) devices emit light by injecting electrons from a cathode and holes from an anode into an emission material layer, combining the electrons with the holes, generating excitons, and transforming the excitons of an excited state to a ground state. Unlike liquid crystal display (LCD) devices, OELD devices do not require an additional light source and therefore have the advantages of slimness and lightweight.

Because OELD devices have excellent characteristics, such as low power consumption, high luminance, fast response time, lightweight and so on, OELD devices can be applied to various electronic products, such as mobile phones, car navigation system (CNS), PDAs, camcorders, palm PCs, and so on. Moreover, due to their simple fabricating process, the fabrication costs of OELD devices are low when compared with those of LCD devices.

The OELD devices are divided into a passive matrix type and an active matrix type according to the driving method thereof. The passive matrix type OELD devices have a simple structure and a simple fabricating process. However, the passive matrix type OELD devices have disadvantages of high power consumption and low quality images. Moreover, the more lines are disposed, the less aperture ratio does the passive matrix type OELD device have. On the other hand, the active matrix type OELD devices have advantages of high emission efficiency and high quality images.

FIG. 1 is a cross-sectional view illustrating an active matrix type OELD device according to the related art.

Referring to FIG. 1, the OELD device 10 includes first and second substrates 12 and 28 facing each other. The first substrate 12 is transparent and flexible. The first substrate 12 has an array element 14 including a plurality of thin film transistors (TFTs) T and an organic electroluminescent diode E including a first electrode 16, an organic luminescent layer 18 and a second electrode 20. The organic luminescent layer 18 in each pixel region P includes one of red, green and blue color materials.

The second substrate 28 includes a moisture absorbent 22 of a powder type. The moisture absorbent 22 removes moisture inside the OELD device 10. The moisture absorbent 22 is in a concave portion of the second substrate 28 and is sealed by a taping 25. The first and second substrates 12 and 28 are attached to each other with a seal pattern 26.

In the OELD device 10, because the first electrode 16 is formed of a transparent material, the light emitted from the organic luminescent layer 18 travels toward the first substrate 12. Accordingly, it is referred to as a bottom emission type OELD device.

FIG. 2 is a circuit diagram of an OELD device according to the related art.

Referring to FIG. 2, gate and data lines 40 and 50 are formed on a substrate 32. The gate and data lines 40 and 50 cross each other and a switching element Ts is formed near the crossing portion of the gate and data lines 40 and 50. The switching element Ts includes a gate electrode 42, a source electrode 52 and a drain electrode 56. The gate electrode 42 is connected to the gate line 40. The source electrode 52 separated from the drain electrode 56 is connected to the data line 50.

A driving element Td is electrically connected to the switching element Ts. The driving element Td of a p-type TFT includes a gate electrode 44, a source electrode 62 and a drain electrode 66. The gate electrode 44 of the driving element Td is connected to the switching element Ts. A storage capacitor Cst is formed between the source and gate electrodes 62 and 44 of the driving element Td. The drain electrode 66 of the driving element Td is connected to the first electrode 16 (of FIG. 1) of the organic electroluminescent diode E. The source electrode 62 of the driving element Td is connected to a power line 47.

When a gate signal from the gate line 40 is supplied to the gate electrode 42 of the switching element Ts, a data signal from the data line 50 is supplied to the gate electrode 44 of the driving element Td through the switching element Ts. Then, the organic electroluminescent diode E is driven by the driving element Td such that the organic electroluminescent diode E emits light. Because the storage capacitor Cst maintains a voltage level of the gate electrode 44 of the driving element Td, even if the switching element Ts is turned off, the organic electroluminescent diode E can continuously emit light for a predetermined period of time.

FIG. 3 is a plan view illustrating a pixel region in an array substrate of an active matrix type OELD device according to the related art and FIG. 4 is a cross-sectional view taken along the line IV-IV of FIG. 3.

Referring to FIGS. 3 and 4, the active matrix type OELD device includes a switching element Ts, a driving element Td and a storage capacitor Cst on a substrate 32. Each pixel P of the OELD device may include more than one pair of the switching element Ts and the driving element Td. The substrate 32 is formed of a transparent and insulating material, such as glass and plastic.

A gate line 40 and a data line 50 are formed on the substrate 32 with an insulating layer interposed therebetween. A power line 47 is formed along the data line 50. A pixel region P is defined by the crossing between the gate and data lines 40 and 50.

The switching element Ts may be a thin film transistor including a first active layer 34, a gate insulating layer 39, a gate electrode 42, a first interlayer insulating layer 41, a second interlayer insulating layer 48, source and drain electrodes 52 and 56. The gate electrode 42 of the switching element Ts corresponds to the first active layer 34 and is connected to the gate line 40. The first interlayer insulating layer 41 is formed on the gate electrode 42 and has a first contact hole 51 and a second contact hole 54. The source electrode 52 of the switching element Ts is connected to the data line 50 and is spaced apart from the drain electrode 56 of the switching element Ts. The source and drain electrodes 52 and 56 are insulated from each other due to the second interlayer insulating layer 48. The drain electrode 56 of the switching element Ts is connected to a gate electrode 44 of the driving element Td through a third contact hole 55.

The driving element Td may be also a thin film transistor including a second active layer 36, a gate insulating layer 39, a gate electrode 44, a first interlayer insulating layer 41, a second interlayer insulating layer 48, source and drain electrodes 62 and 66. The gate electrode 44 of the driving element Td corresponds to the second active layer 36 and is connected to the drain electrode 56 of the switching element Ts through the third contact hole 55. The first interlayer insulating layer 41 is also formed on the gate electrode 44 of the switching element Td and has a fourth contact hole 61 and a fifth contact hole 65. The source electrode 62 of the driving element Td is connected to the power line 47 through a sixth contact hole 49 and is spaced apart from the drain electrode 66 of the driving element Td. The source and drain electrodes 62 and 66 of the driving element Td are insulated from each other due to the second interlayer insulating layer 48.

A first passivation layer 68 is formed on the switching and driving elements Ts and Td and exposes a portion of the driving electrode 66 of the driving element Td. An organic electroluminescent diode E having a first electrode 70, an organic luminescent layer 74 and a second electrode 76 is formed over the substrate including the switching and driving elements Ts and Td. The first electrode 70 is connected to the drain electrode 66 of the driving element Td, and the organic luminescent layer 74 is interposed between the first and second electrodes 70 and 76. In addition, a second passivation layer 72 is formed on the first electrode 70 to insulate from the second electrode 76.

Moreover, an impurity-doped silicon layer 38 is formed on the substrate 32 and under the power line 47. The impurity-doped silicon layer 38 and the power line 47 respectively function as first and second capacitor electrodes, and the first interlayer insulating layer 41 therebetween functions as a dielectric material. The first capacitor electrode, the second capacitor electrode, and the dielectric material constitute a storage capacitor Cst.

FIG. 5 is a schematic cross-sectional view of an organic electroluminescent diode of a conventional OELD device.

Referring to FIG. 5, the OELD device includes the organic electroluminescent diode E over the substrate 32. The organic electroluminescent diode E includes the first electrode 70, the organic luminescent layer 74 and the second electrode 76. The first and second electrodes 70 and 76 may be referred to as an anode and a cathode, respectively. When voltages are applied to the first and second electrodes 70 and 76, the first and second electrodes 70 and 76 respectively output holes and electrons. The organic luminescent layer 74 includes a hole injection layer (HIL) 74a, a hole transporting layer (HTL) 74b, an emission material layer 74c including a red emission material layer EML(R), a green emission material layer EML(G) and a blue emission material layer EML(B), an electron transporting layer (ETL) 74d and an electron injection layer (EIL) 74e. Because an organic material has very different mobilities with respect to the hole and the electron, the organic electroluminescent diode E includes the hole transporting layer 74a and the electron transporting layer 74d to effectively transport the holes and electron from the first and second electrodes 70 and 76 into the emission material layer 74c. It is possible to obtain a balance between the holes and the electrons such that emission efficiency is improved. The organic electroluminescent diode E includes the hole injection layer 74a between the first electrode 70 and the hole transporting layer 74b and the electron injection layer 74e between the second electrode 76 and the electron transporting layer 74d. The hole injection layer 74a decreases a barrier energy for injecting the hole into the emission material layer 74c, and the electron injection layer 74e decreases a barrier energy for injecting the electron into the emission material layer 74c. As a result, there are advantages that emission efficiency is improved and driving voltage is reduced. In generally, when the hole injection layer 74a is formed of a crystallizable material such as perylene, tri-phenylene, it is much effective to reduce the driving voltage. However, the crystallizable material has an un-uniform arrangement of grains. It causes deterioration in the organic electroluminescent diode E and decrease of lifetime of the OELD device.

FIG. 6 shows an arrangement of grains in a hole injection layer according to the related art, FIG. 7 is a picture showing a surface of hole injection layer according to the related art, and FIG. 8 is a picture showing an emission state of an organic electroluminescent diode according to the related art.

As shown in FIG. 6, a first electrode 70 of a transparent conductive material, such as indium-tin-oxide (ITO), and a hole injection layer 74a of a crystallizable material are laminated over a substrate 32. The transparent conductive material of the first electrode 70 may have one of amorphous phase and crystallized phase. The amorphous phase is changed into the crystallized phase by heating. FIG. 6 shows the first electrode 70 of the crystallized phase. Because the ITO material having the crystallized phase has a uniformly arranged grains A, the first electrode 70 has an even surface to have an excellent interface with the hole injection layer 74a. However, grains B of the hole injection layer 74a of the crystallizable material are un-uniformly arranged. Some grains protrude from the upper surface of the hole injection layer 74a. Accordingly, the hole injection layer has an uneven upper surface.

Referring to FIG. 7, the grains B has different sizes. Because light emitted from the organic luminescent layer 74c passes through the hole injection layer 74a, the protruding grains from the upper surface of the hole injection layer 74a cause defect sites D. When the OELD device having the above mentioned hole injection layer 74a is driven, currents are concentrated into the defect sites D to have brightness much than other sites. Namely, the defect site D becomes a bright site. Moreover, as the concentration of the currents is progressed, the defect sites D have brightness less than the other sites. Namely, the defect site D becomes a dark site. It causes a deterioration problem in the emission material layer 74c (of FIG. 6).

Referring to FIG. 8, the OELD device can not produce a uniform brightness due to the defect sites D (of FIG. 7) of the hole injection layer 74a (of FIG. 6). Accordingly, the OELD device does not display high quality images. Moreover, lifetime of the OELD device decreases because of the deterioration problem in the emission material layer 74c (of FIG. 6).

SUMMARY OF THE INVENTION

Accordingly, the present invention is directed to an organic electroluminescent display (OELD) device and method for fabricating the same that substantially obviate one or more of the problems due to limitations and disadvantages of the related art.

An advantage of the present invention is to provide an OELD device with a uniform luminance and prevent decreasing of lifetime of the OELD device.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display (OELD) device includes first and second substrates facing each other; a plurality of gate lines, a plurality of data lines and a plurality of power lines on the first substrate, the gate and data lines crossing each other to define a plurality of pixel regions, a switching element and a driving element connected to each other in each pixel region, a first electrode connected to the driving element, an organic luminescent layer on the first electrode, and a second electrode on the organic luminescent layer. The organic luminescent layer includes a hole injection layer, a hole transporting layer, an emission material layer, an electron transporting layer, and an electron injection layer in order. Further, the hole injection layer includes a crystallizable hole injection material and a hole transporting material, and the hole transporting layer includes the hole transporting material.

In another aspect of the present invention, a method of fabricating an organic electroluminescent diode for an organic electroluminescent display (OELD) device includes forming a first electrode having a first work function, forming a hole injection layer on the first electrode, the hole injection layer including a crystallizable hole injection material and a hole transporting material, forming a hole transporting layer on the hole injection layer, the hole transporting layer including the hole transporting material, forming an emission material layer on the hole transporting layer, forming an electron transporting layer on the emission material layer, forming an electron injection layer on the electron transporting layer; and forming a second electrode on the electron injection layer, the second electrode having a second work function smaller than the first work function.

In another aspect of the present invention, a method of fabricating an organic electroluminescent diode for an organic electroluminescent display (OELD) device includes forming a first electrode having a first work function, forming an electron injection layer on the first electrode, forming an electron transporting layer on the electron injection layer, forming an emission material layer on the electron transporting layer, forming a hole transporting layer on the emission material layer, the hole transporting layer including a hole transporting material, forming a hole injection layer on the hole transporting layer, the hole injection layer including a crystallizable hole injection material and the hole transporting material, and forming a second electrode on the hole injection layer, the second electrode having a second work function larger than the first work function.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. The same reference numbers may be used throughout the drawings to refer to the same or like parts.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

In an OELD device of the present invention, a hole injection layer includes a first material forming the hole injection layer in a conventional OELD device and a second material forming the hole transporting layer in a conventional OELD device to improve properties of the hole injection layer.

Figure 1:
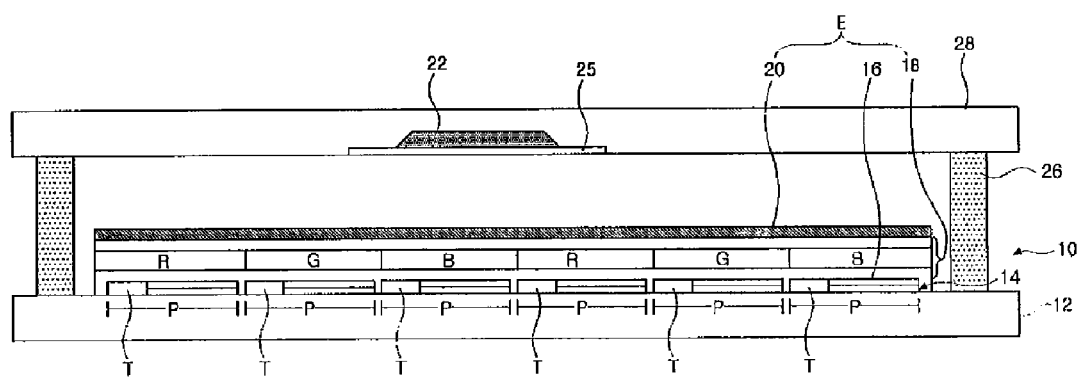
FIG. 1 is a cross-sectional view illustrating an active matrix type OELD device according to the related art.
Figure 2:
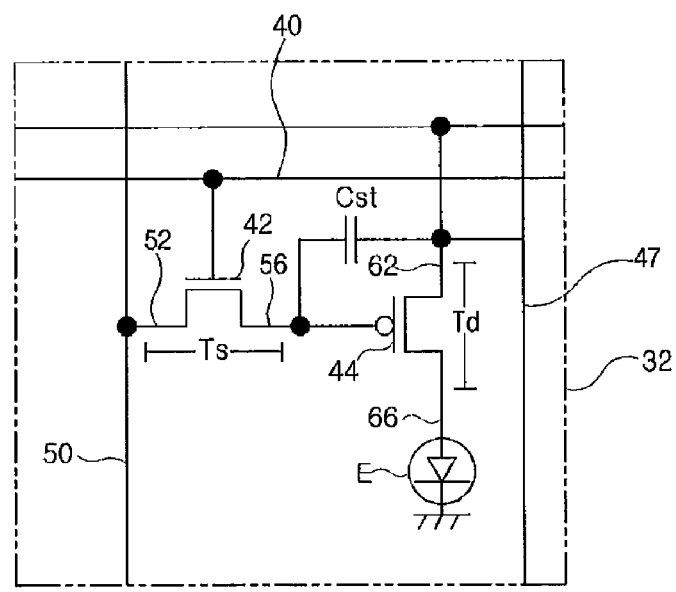
FIG. 2 is a circuit diagram of an OELD device according to the related art.
Figure 3:
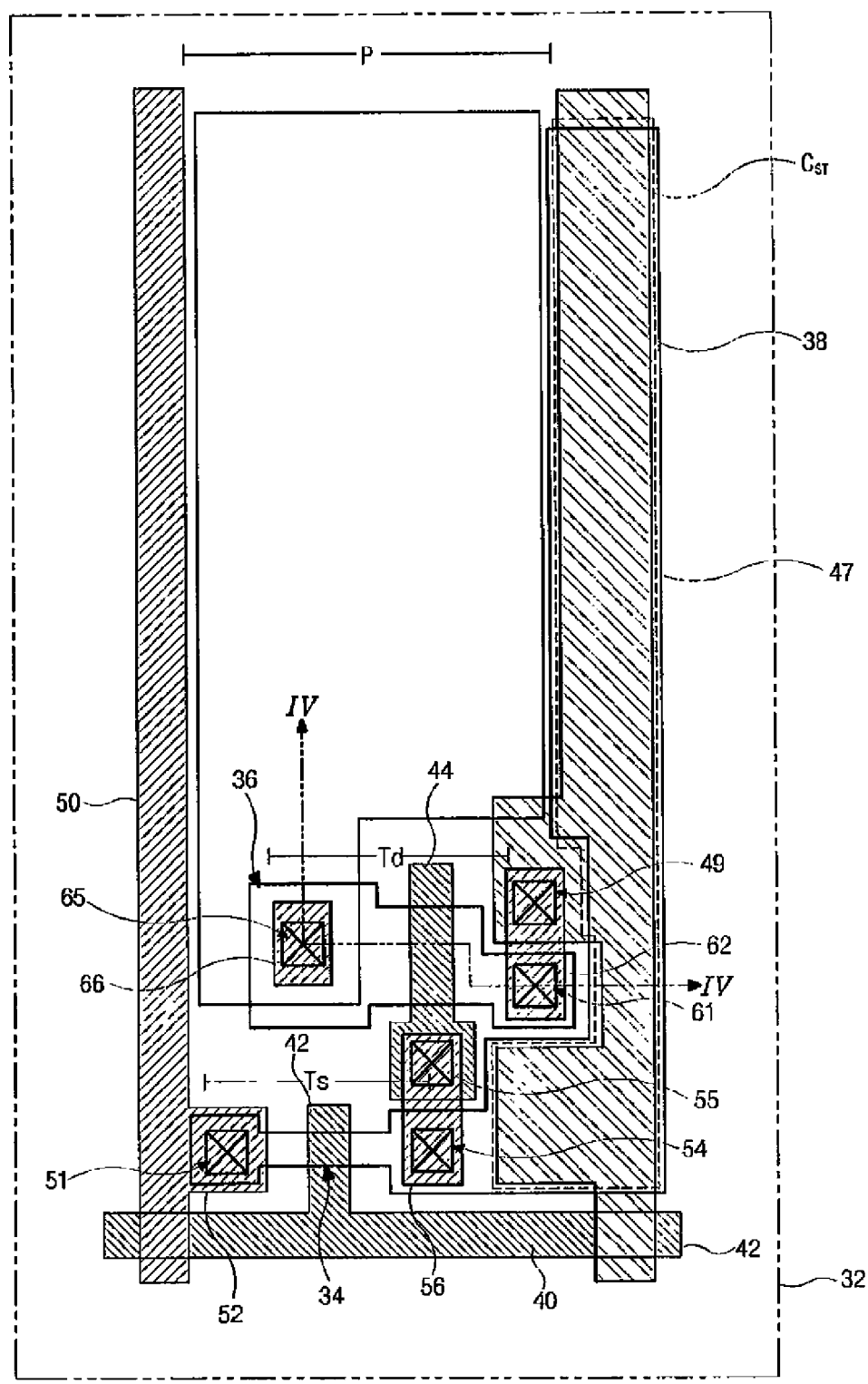
FIG. 3 is a plan view illustrating a pixel region in an array substrate of an active matrix type OELD device according to the related art.
Figure 4:
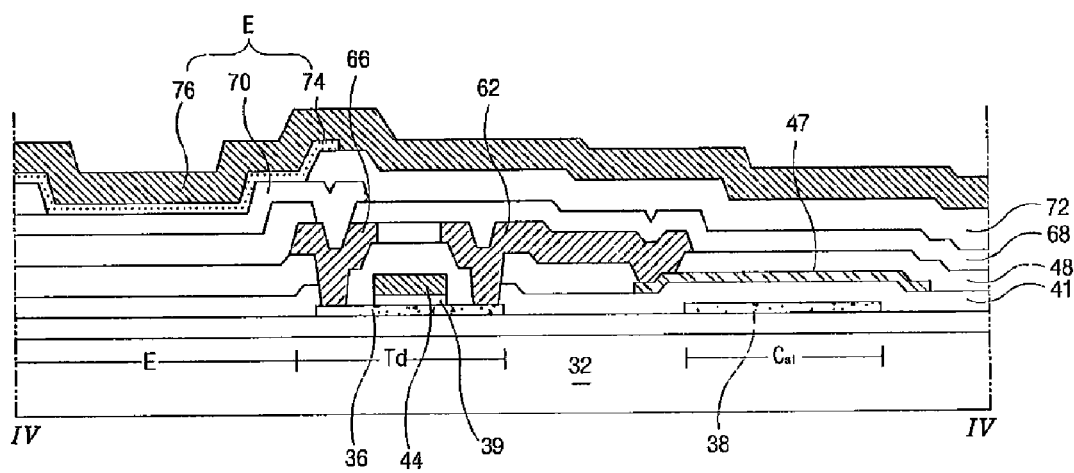
FIG. 4 is a cross-sectional view taken along the line IV-IV of FIG. 3.
Figure 5:
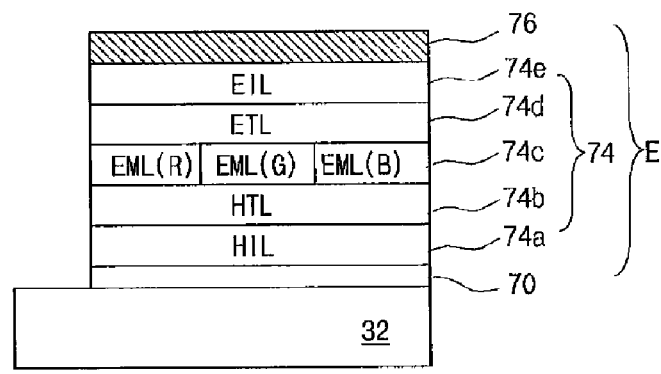
FIG. 5 is a schematic cross-sectional view of an organic electroluminescent diode of a conventional OELD device.
Figure 6:
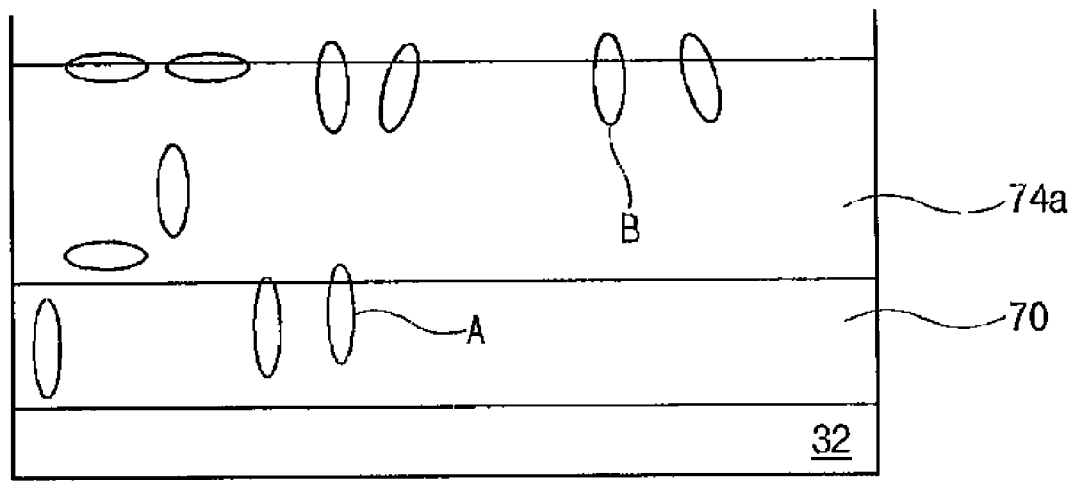
FIG. 6 shows an arrangement of grains in a hole injection layer according to the related art.
Figure 7:
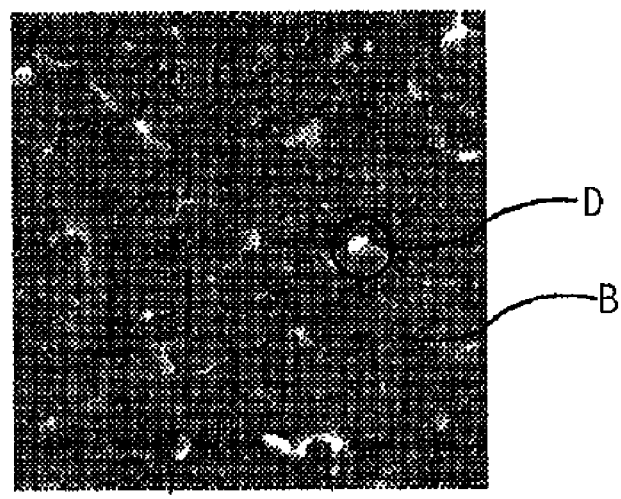
FIG. 7 is a picture showing a surface of hole injection layer according to the related art.
Figure 8:
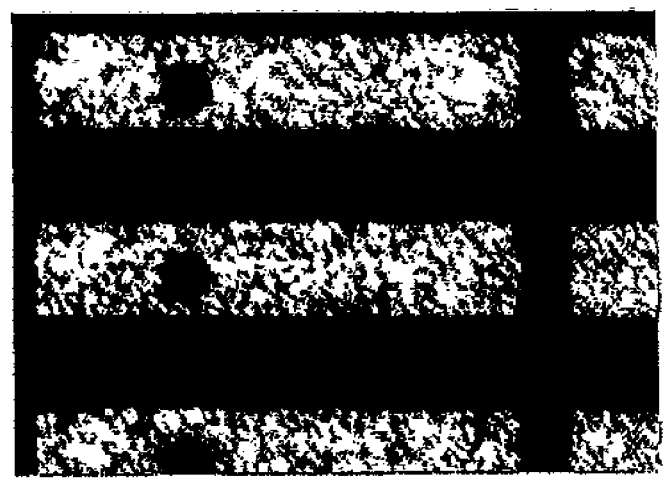
FIG. 8 is a picture showing an emission state of an organic electroluminescent diode according to the related art.
Figure 9:
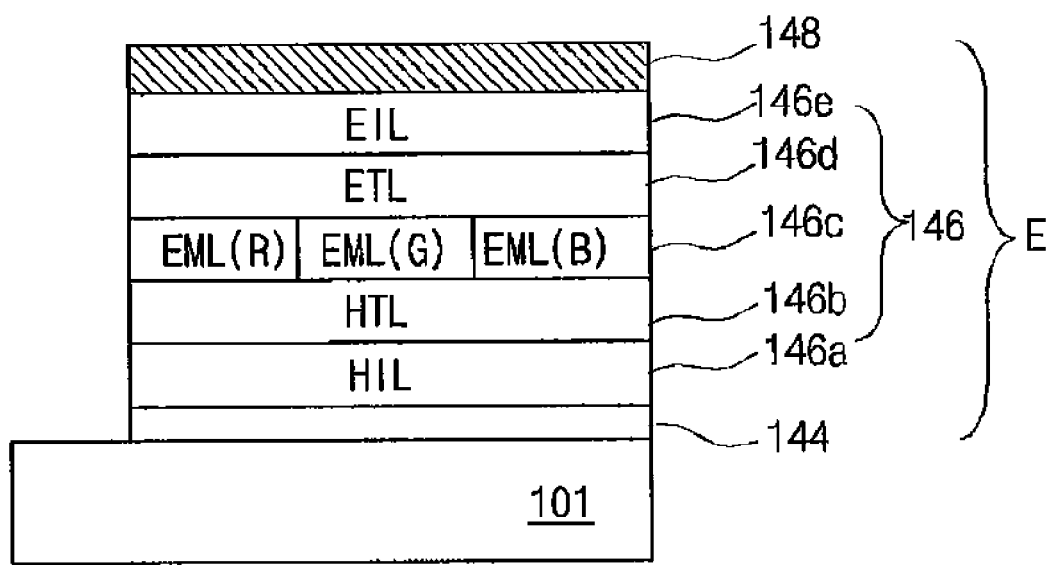
FIG. 9 is a schematic cross-sectional view of an organic electroluminescent diode of an OELD device according to the present invention.

FIG. 9 is a schematic cross-sectional view of an organic electroluminescent diode of an OELD device according to the present invention. Referring to FIG. 9, an OELD device according to the present invention includes an organic electroluminescent diode E over a substrate 101. The organic luminescent diode E includes a first electrode 144, a second electrode 148 and an organic luminescent layer 146 interposed therebetween. The first electrode 144 may be formed of a transparent conductive material, such as indium-tin-oxide (ITO) and indium-zinc-oxide (IZO) and function as an anode. The second electrode 148 may be formed of an opaque conductive material and function as a cathode. The second electrode 148 has either a single layer including one of calcium (Ca), aluminum (Al), magnesium (Mg), silver (Ag) and lithium (Li) or a double layer including fluorolithium and aluminum (LiF/Al).

The organic luminescent layer 146 has laminated layers of a hole injection layer (HIL) 146a, a hole transporting layer (HTL) 146b, an emission material layer 146c including a red emission material layer EML(R), a green emission material layer EML(G) and a blue emission material layer EML(B), an electron transporting layer 146d and an electron injection layer 146e. The hole injection layer 146a and the electron injection layer 146e respectively facing the first and second electrodes 144 and 148. The hole injection layer 146a includes a crystallizable hole injection material and a hole transporting material. A volumetric ratio of the crystallizable hole injection material and the hole transporting material in the hole injection layer 146a ranges from approximately about 5:1 to about 30:1. The crystallizable hole injection material and the hole transporting material are deposited on the first electrode 144 at the same time to form the hole injection layer 146a. The hole transporting material prevents over-crystallizing of the crystallizable hole injection layer such that the hole injection layer 146a has more even surface than the hole injection layer according to the related art which does not have the hole transporting material. The crystallizable hole injection material includes one of triphenylene, triphenylamine derivatives, perylene, pyrene, tetracene and anthracene, and the hole transporting material includes an amine group material such as triphenylamine and triphenylamine derivatives.

The two materials in different crucibles are heated to be evaporated and deposited on the first electrode 144. The ratio of the crystallizable hole injection material and the hole transporting material in the hole injection layer 146a is controlled by differing heating temperatures. For example, the ratio of the crystallizable hole injection material and the hole transporting material in the hole injection layer 146a is desired to be 10:1, the heating temperatures are set to have deposition rates of the crystallizable hole injection material and the hole transporting material may be 3 angstrom per second and 0.3 angstrom per second, respectively.

Figure 10A:
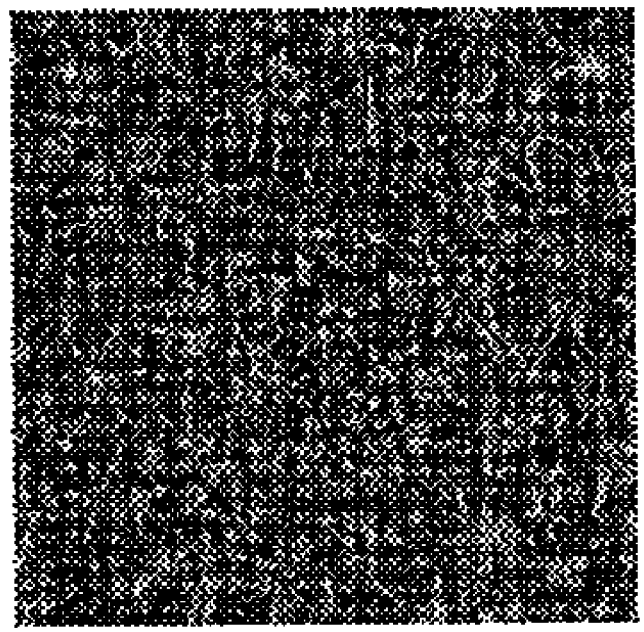
FIGS. 10A and 10B are pictures respectively showing a surface of a hole injection layer having different composition of an OELD device accord 11g to the present invention.
Figure 10B:
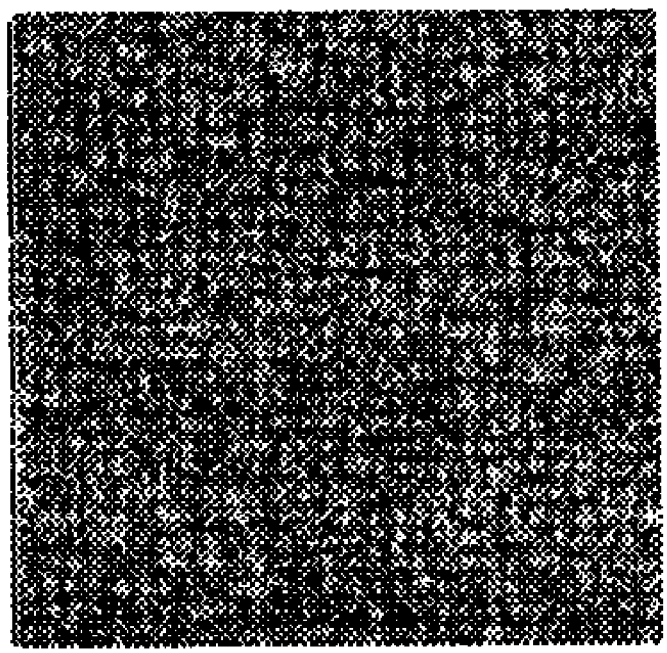

FIGS. 10A and 10B are pictures respectively showing a surface of a hole injection layer having different composition of an OELD device according to the present invention. Surfaces of the hole injection layer respectively having a volumetric ratio of the crystallizable hole injection material and the hole transporting material in 7:1 and 10:1 are shown in FIGS. 10A and 10B. The hole injection layer in FIG. 10B has a more uniform surface than the hole injection layer in FIG. 10A. Namely, the less hole transporting material the hole injection layer includes, the more uniform the surface of the hole injection layer is. In this instance, when the hole injection layer includes the hole transporting material less than the ratio of 30:1, the hole transporting material does not have a desired function such that the problems discussed in the related art are not resolved. On the other hand, when the hole injection layer includes the hole transporting material such that the ratio is greater than 5:1, the hole injection layer does not have a desired hole injecting function.

Figure 11:
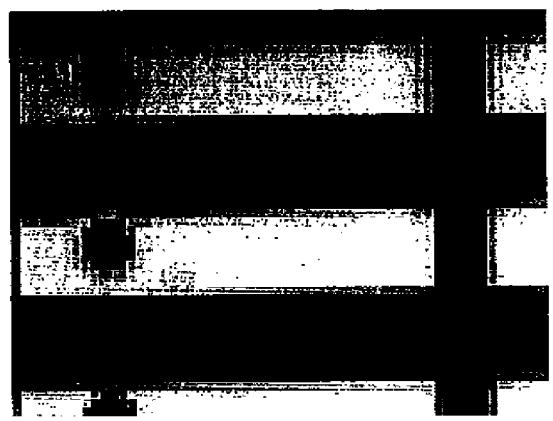
FIG. 11 is a picture showing an emission state of an organic electroluminescent diode of an OELD device according to the present invention.

When the OELD device including the above mentioned organic electroluminescent diode is driven, the OELD device has a uniform brightness as shown in FIG. 11.

Figure 12A:
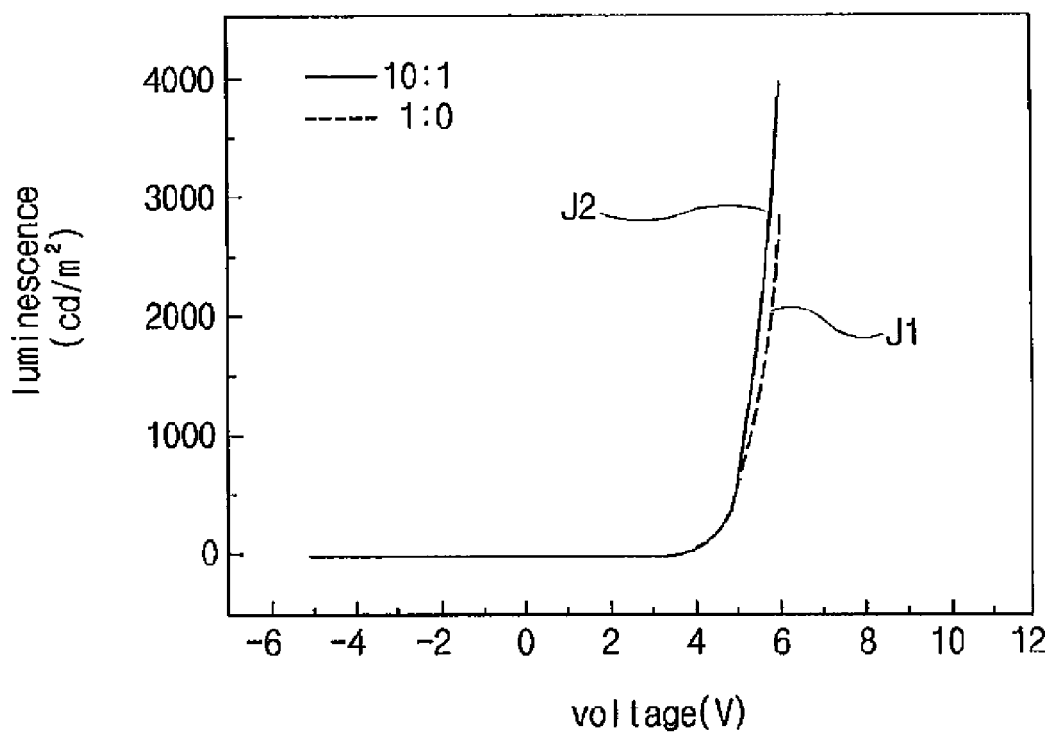
FIGS. 12A to 12C are graphs respectively showing properties between luminance and voltage, between current and voltage, and between luminance and lifetime in a hole injection layer of an OELD device according to the present invention.
Figure 12B:
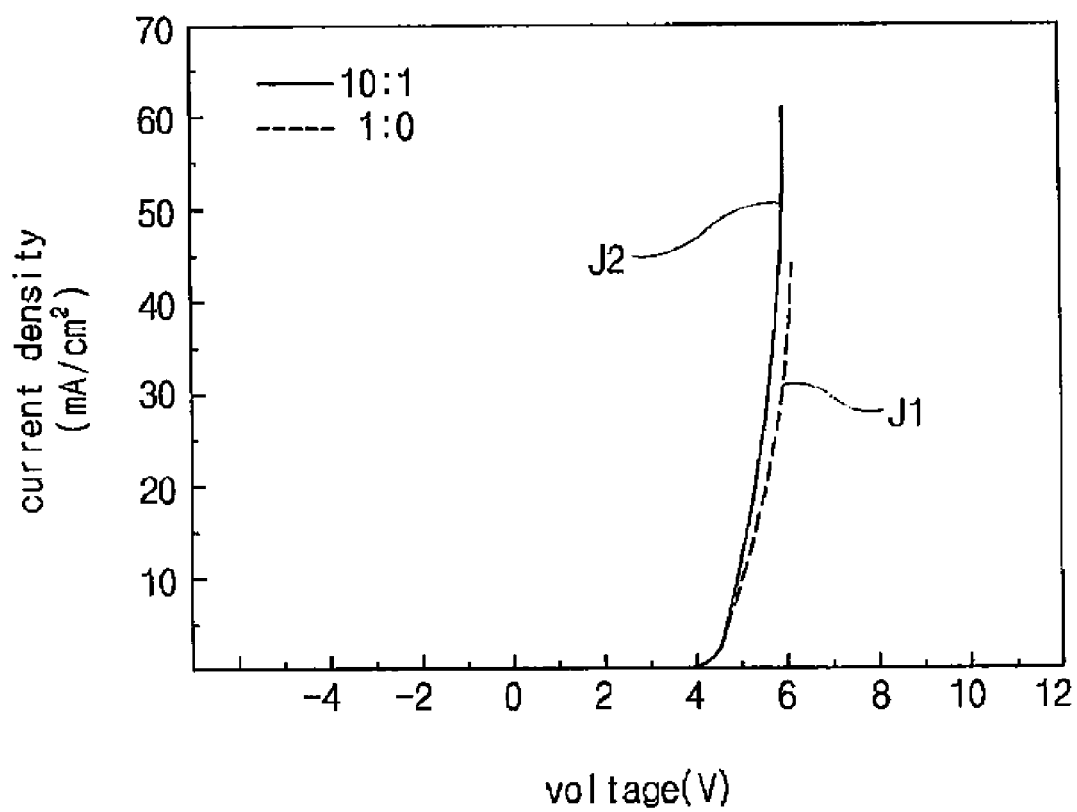
Figure 12C:
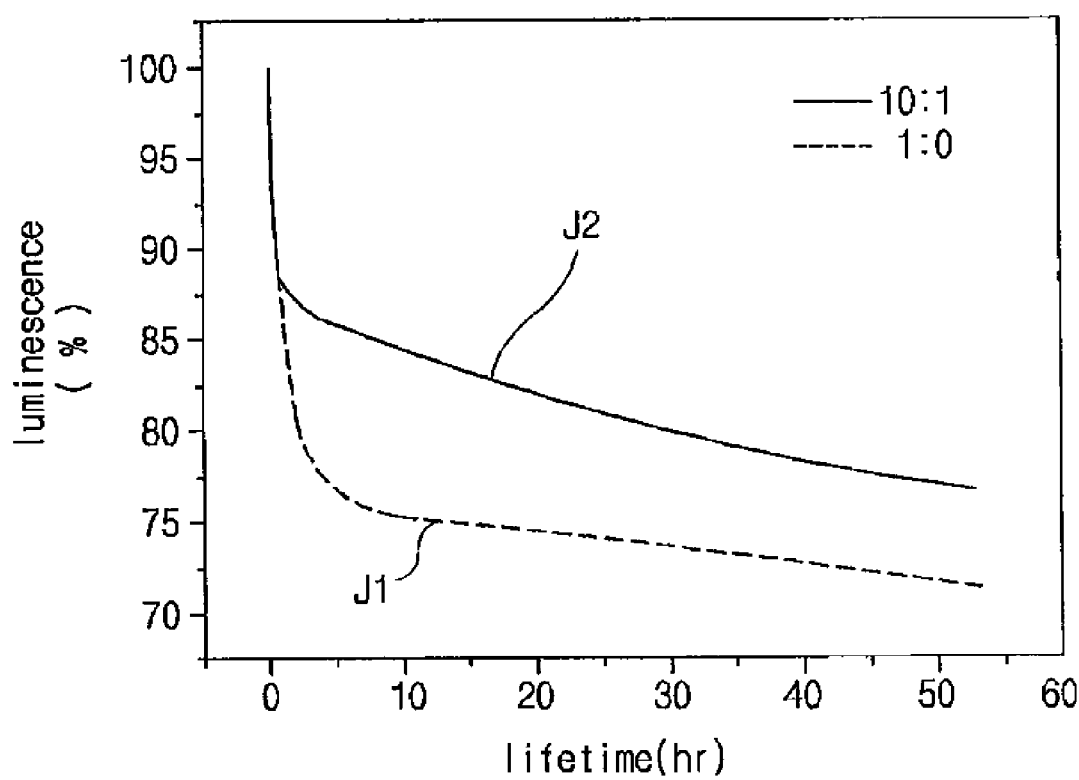

FIGS. 12A to 12C are graphs respectively showing properties between luminance and voltage, between current and voltage, and between luminance and lifetime in a hole injection layer of an OELD device according to the present invention. In FIGS. 12A to 12C, dotted line J1 illustrates properties of the hole injection layer including the crystallizable hole injection material without the hole transporting material, while solid line J2 illustrates properties of the hole injection layer including the crystallizable hole injection material as well as the hole transporting material according to the present invention. Namely, the dotted line J1 shows the properties of the hole injection layer where a volumetric ratio of the crystallizable hole injection material to the hole transporting material is 1:0, and the solid line J2 shows the properties of the hole injection layer where a volumetric ratio of the crystallizable hole injection material to the hole transporting material is 10:1.

In FIG. 12A, when the same voltage is supplied to the first and second electrodes of the organic luminescent diode, the solid line J2 has luminescence greater than the dotted line J1. Thus, the OELD device according to the present invention has luminescence greater than the conventional OELD device. The solid line J2 has luminescence 1000 nit as much as the dotted line J1 in maximum at the same voltage. That is, a difference in luminescence between the solid line J2 and the dotted line J3 may be about 1000 nits at 6V, for example. Similarly, as shown in FIG. 12B, the solid line J2 has current density greater than the dotted line J1 at the same voltage.

On the other hand, as shown in FIG. 12C, the solid line J2 illustrates that the luminescence decreases at a lower rate than the dotted line J1 as the lifetime increases. This is because the hole transporting material in the hole injection layer prevents the grains of the hole injection material from protruding from the surface of the hole injection layer 146a. As mentioned above, the protruding grains cause the deterioration problems. Accordingly, the OELD device according to the present invention has an improved lifetime.

Figure 13:
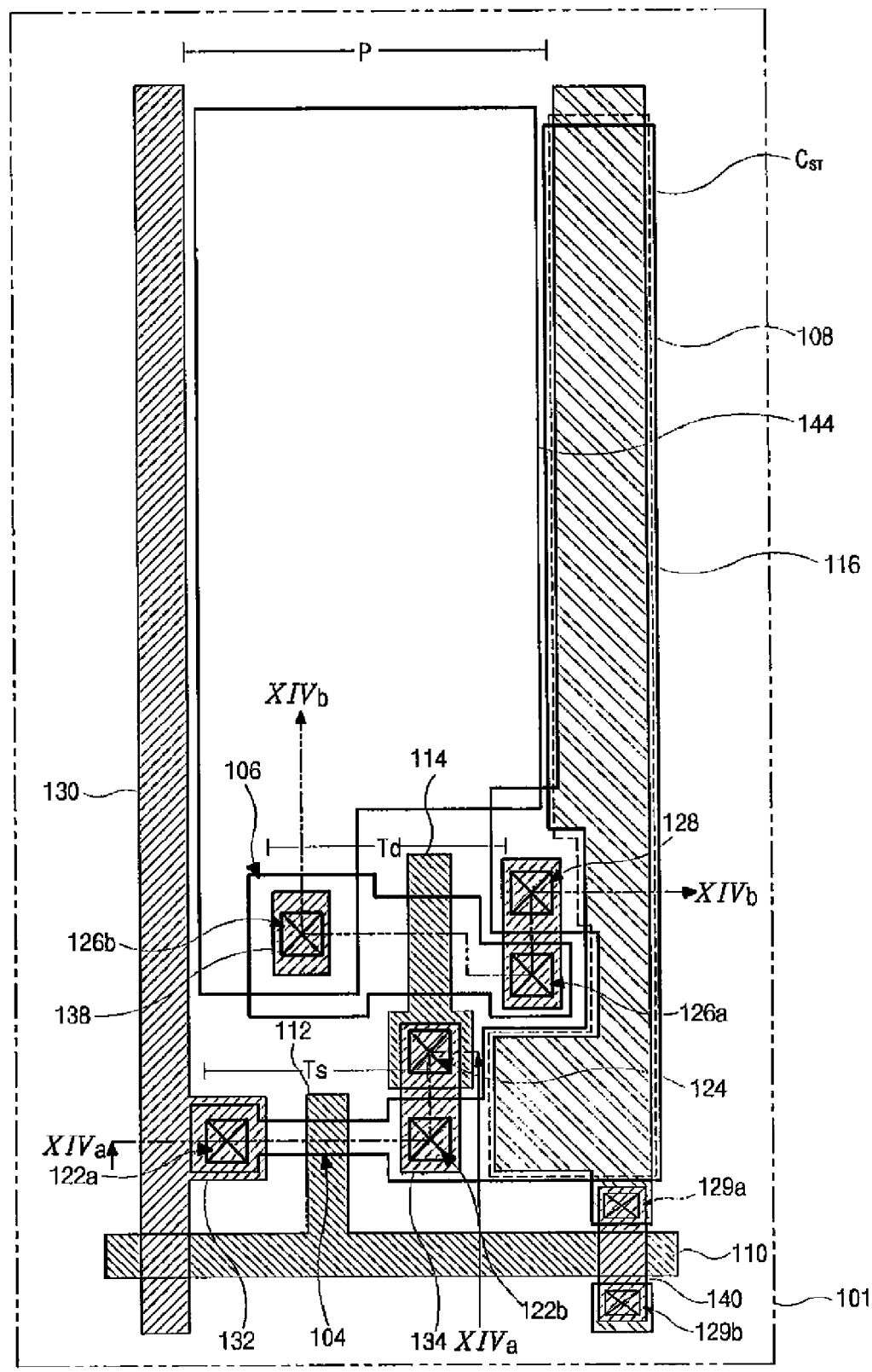
FIG. 13 is a plan view illustrating a pixel region in an array substrate of an active matrix type OELD device according to the present invention.

FIG. 13 is a plan view illustrating a pixel region in an array substrate of an active matrix type OELD device according to the present invention, and FIGS. 14A to 14E are cross-sectional views showing a process of fabricating a portion taken along the lines XIVa-XIVa and XIVb-XIVb of FIG. 13. Referring to FIG. 13, the active matrix type OELD device includes a switching element Ts, a driving element Td and a storage capacitor Cst on a substrate 101. Each pixel P of the OELD device may include more than one pair of the switching element Ts and the driving element Td. The substrate 101 is formed of a transparent and insulating material, such as glass or plastic. Further, a gate line 110 and a data line 130 are formed on the substrate 101 with an insulating layer interposed therebetween. A power line 116 is formed along the data line 130. A pixel region P is defined by the crossing between the gate and data lines 110 and 130.

The switching element Ts may be a thin film transistor including a first active layer 104, a gate insulating layer (not shown), a first gate electrode 112, a first source electrode 132 and a first drain electrode 134. The first gate electrode 112 of the switching element Ts corresponds to the first active layer 104 and is connected to the gate line 110. The first source electrode 132 and the first drain electrode 134 of the switching element Ts are respectively connected to the first active layer 104 through first and second contact holes 122a and 122b. The first source electrode 132 of the switching element Ts is connected to the data line 130 and is spaced apart from the first drain electrode 134 of the switching element Ts.

The driving element Td may be also a thin film transistor including a second active layer 106, a gate insulating layer (not shown), a second gate electrode 114, a second source electrode 136 and a second drain electrode 138. The second gate electrode 114 of the driving element Td corresponds to the second active layer 106 and is connected to the first drain electrode 134 of the switching element Ts through a third contact hole 124. The second source electrode and the second drain electrode 138 of the driving element Td are respectively connected to the second active layer 106 through fourth and fifth contact holes 126a and 126b. The second source electrode 136 of the driving element Td is connected to the power line 116 through a sixth contact hole 128 and is spaced apart from the second drain electrode 138 of the driving element Td. The second drain electrode 138 of the driving element Td is connected to a first electrode 144 of an organic electroluminescent diode (not shown). In FIG. 13, because the power line 116 is formed of the same layer as the gate line 110, the power line 116 is disconnected at crossing porting with the gate line 110 to avoid electrical short. A power line connection pattern 140, which may be formed of the same layer as the data line 130, connects the disconnected portion of the power line 116 through the seventh and eighth contact holes 129a and 129b.

Moreover, an impurity-doped silicon layer 108 is formed on the substrate 101 and under the power line 116. The impurity-doped silicon layer 108 and the power line 116 respectively function as first and second capacitor electrodes, and the gate insulating layer (not shown) therebetween functions as a dielectric material. The first capacitor electrode, the second capacitor electrode, and the dielectric material constitute a storage capacitor Cst.

Although not shown, an emission material layer and a second electrode of the organic electroluminescent diode are laminated on the first electrode. As mentioned above, the emission material layer includes a hole injection layer formed of a crystallizable hole injection material and a hole transporting material.

Figure 14A:
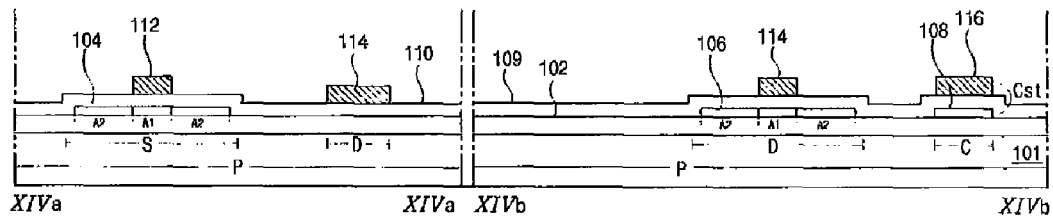
FIGS. 14A to 14F are cross-sectional views showing a process of fabricating a portion taken along the lines XIVa-XIVa and XIVb-XIVb of FIG. 13.

Referring to FIGS. 14A to 14F, methods of fabricating an organic electroluminescent diode and an OELD device having the same according to the present invention are explained. In FIG. 14A, a buffer layer 102 is formed on the substrate 101 where a pixel region P, a switching region S, a driving region D and a capacitor region C are defined. The pixel region P is defined by crossing between the gate and data lines 110 and 130. The switching and driving elements Ts and Td are respectively formed in the switching and driving regions S and D, and the storage capacitor Cst is formed in the capacitor region C. The buffer layer 102 functions as a blocking layer for preventing an alkali ion from diffusing into the first and second active layers 104 and 106. The alkali ion causes damages on properties of the first and second active layers 104 and 106. However, if not necessary, the buffer layer 102 can be omitted.

Next, a polycrystalline silicon layer (not shown) is formed on the substrate 101 by depositing, dehydrating and crystallizing intrinsic amorphous silicon (a-Si:H). The polycrystalline silicon layer (not shown) is patterned to form a first polycrystalline silicon pattern 104 in the switching region S, a second polycrystalline silicon pattern 106 in the driving region D, and a third polycrystalline silicon pattern 108 in the capacitor region C. Ions are doped onto the third polycrystalline silicon pattern 108 to form the impurity-doped amorphous silicon layer 108. As mentioned above, it functions as the first capacitor electrode of the storage capacitor Cst.

Next, the gate insulating layer 109 is formed on the first and second polycrystalline silicon patterns 104 and 106, and the first capacitor electrode 108. A first metal layer (not shown) is formed on the gate insulating layer 109 and patterned to form a first gate electrode 112 in the switching region S, a second gate electrode 114 in the driving region D, and the power line 116 in the capacitor region C. Namely, the first gate electrode 112, the second gate electrode 114 and the power line 116 correspond to a center portion of the first polycrystalline silicon pattern 104, a center portion of the second polycrystalline silicon pattern 106 and the first capacitor electrode 108, respectively. The center portions of the first polycrystalline silicon pattern 104 and the second polycrystalline silicon pattern 106 are defined as a first active region A1, and both side portions of the first polycrystalline silicon pattern 104 and both side portions of the first polycrystalline silicon pattern 106 are defined as a second active region A2. The power line 116 overlaps the first capacitor electrode 108 to function as a second capacitor electrode. The first capacitor electrode 108, the second storage capacitor electrode 116 and the gate insulating layer 109 therebetween constitute the storage capacitor Cst. Because the power line 116 crosses and is formed of the same material as the gate line, the power line 116 is disconnected at crossing portion with the gate line to avoid electrical short. At the same time, the gate line (not shown) is formed along widthwise direction. The first gate electrode 112 of the switching element Ts is connected to the gate line (not shown).

Figure 14B:
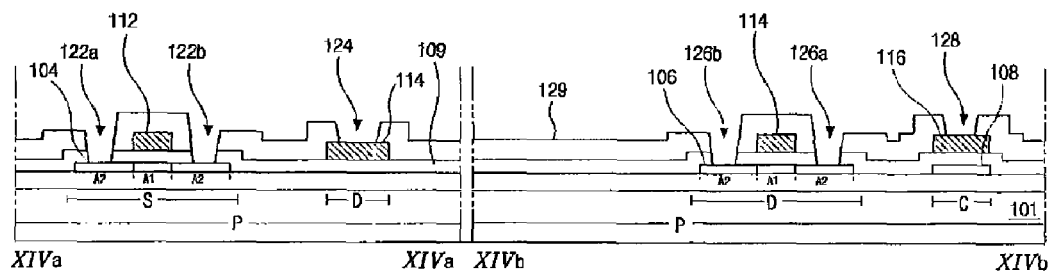

In FIG. 14B, an interlayer insulating layer 129 is formed on the first and second gate electrodes 112 and 114, the power line 116 and the gate line (not shown) and patterned to form the first to sixth contact holes 122a, 122b, 124, 126a, 126b and 128. The first and second contact holes 122a and 122b respectively expose the second active regions A2 of the first active layer 104, and the third contact hole 124 exposes a portion of the second gate electrode 114. The fourth and fifth contact holes 126a and 126b respectively expose the second active regions A2 of the first active layer 106, and the sixth contact hole 128 exposes a portion of the power line 116. Although not shown, the seventh and eighth contact holes 129a and 129b are formed to respectively expose disconnected portions of the power line 116. Further, impurities are doped onto the second active regions A2 of the first and second active layers 104 and 106 through the first, second, fourth and fifth contact holes 122a, 122b, 126a and 126b.

Figure 14C:
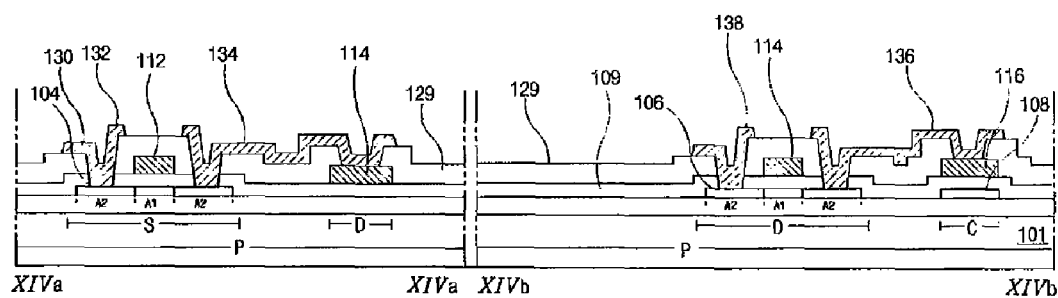

In FIG. 14C, a second metal layer (not shown) is formed on the interlayer insulating layer 129 and patterned to form the data line 130, the first source electrode 132, the first drain electrode 134, the second source electrode 136 and the second drain electrode 138. The data line 130 crosses the gate line 110 to define the pixel region P and is connected to the first source electrode 132 of the switching element Ts. The first source electrode 132 and the first drain electrode 134 are respectively connected to the second active regions A2 of the first active layer 104 through the first and second contact holes 122a and 122b (of FIG. 14B), and the second source electrode 136 and the second drain electrode 138 are respectively connected to the second active regions A2 of the second active layer 106 through the fourth and fifth contact holes 126a and 126b (of FIG. 14B). Moreover, the first drain electrode 134 is connected to the second gate electrode 114 of the driving element Td through the third contact hole 124 (of FIG. 14B), and the second source electrode 136 is connected to the power line 116 through the sixth contact hole 128. Although not shown, the power line connection pattern is formed at the disconnected portion of the power line 116. The power line connection pattern is connected to the power line 116 through the seventh and eighth contact holes 129a and 129b.

Figure 14D:
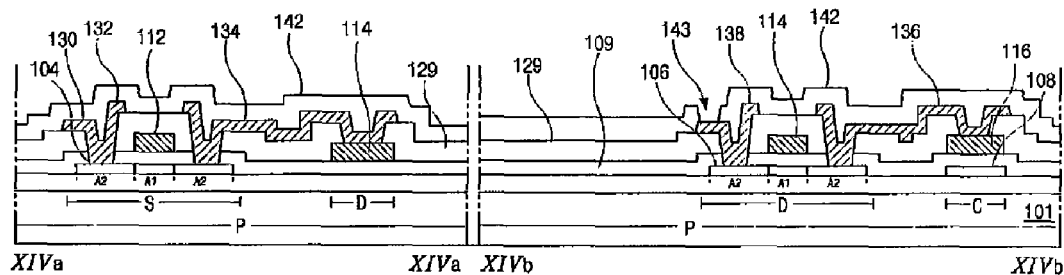

Next, in FIG. 14D, a passivation layer 142 is formed on the first and second source electrodes 132 and 136, the first and second drain electrodes 134 and 138, and the data line 130 and patterned to form a ninth contact hole 143 exposing the second drain electrode 138 of the driving element Td.

Figure 14E:
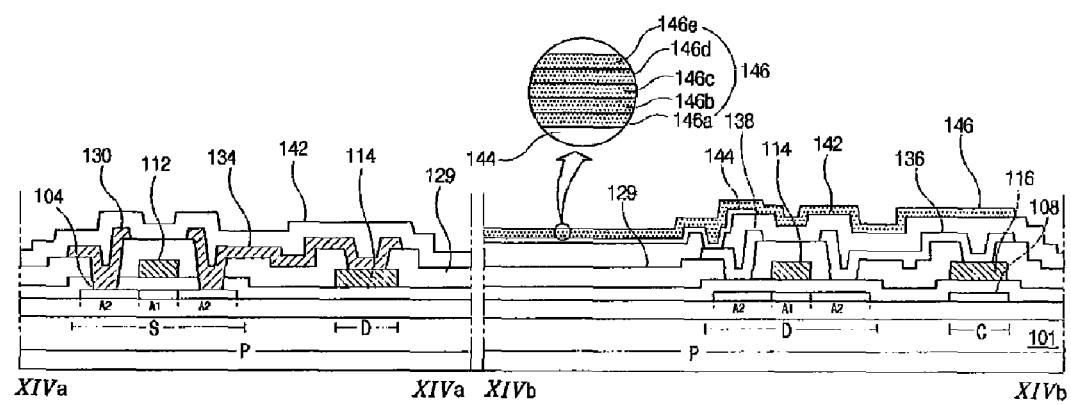

In FIG. 14E, a transparent conductive material layer (not shown) including one of indium-tin-oxide (ITO) and indium-zinc-oxide (IZO) is formed on the passivation layer 142 and patterned to form the first electrode 144. The first electrode 144 is connected to the second drain electrode 138 of the driving element Td through the ninth contact hole 143. And then, the organic luminescent layer 146 including a hole injection layer 146a, a hole transporting layer 146b, an emission material layer 146c, an electron transporting layer 146d and an electron injection layer 146e is formed on the first electrode 144. The hole injection layer 146a is formed by evaporating and depositing a crystallizable hole injection material and a hole transporting material at the same time. A volumetric ratio of the crystallizable hole injection material to the hole transporting material ranges from approximately 5:1 to 30:1. The crystallizable hole injection material and the hole transporting material are evaporated under different temperature to control the ratio. The hole injection layer 146a has a uniform surface due to the hole transporting material. The crystallizable hole injection material includes one of triphenylene, triphenylamine derivatives, perylene, pyrene, tetracene and anthracene, and the hole transporting material includes an amine group material such as triphenylamine and triphenylamine derivatives.

Figure 14F:
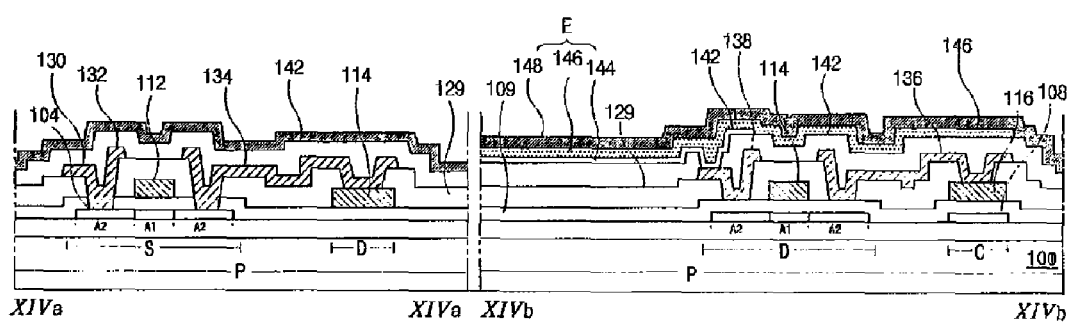

Next, in FIG. 14F, the second electrode 148 is formed on the organic luminescent layer 146. The second electrode 148 may be either a single layer including one of calcium (Ca), aluminum (Al), magnesium (Mg), silver (Ag) and lithium (Li) or a double layer including fluorolithium and aluminum (LiF/Al).

The first electrode 144, the second electrode 148 and the organic luminescent layer 146 therebetween constitute the organic electroluminescent diode E. The first electrode 144 functions as an anode to emit holes, and the second electrode 148 functions as a cathode to emit electrons. Light emitted from the organic luminescent layer 146 passes through the first electrode 144.

A lower substrate of the OELD device is fabricated by the above processes. Although not shown, the OELD device is fabricated by attaching an upper substrate including a moisture absorbent to the lower substrate.

Even though a bottom emission type OELD is explained, in which the first electrode is formed of ITO, the first embodiment could be applied to a top emission type OELD in which the second electrode is formed of ITO. In the top emission type OELD, the order of the hole injection layer, the hole transporting layer, the emission material layer, the electron transporting layer and the electron injection layer should be reversed in comparison with the bottom emission type OELD.

Figure 15:
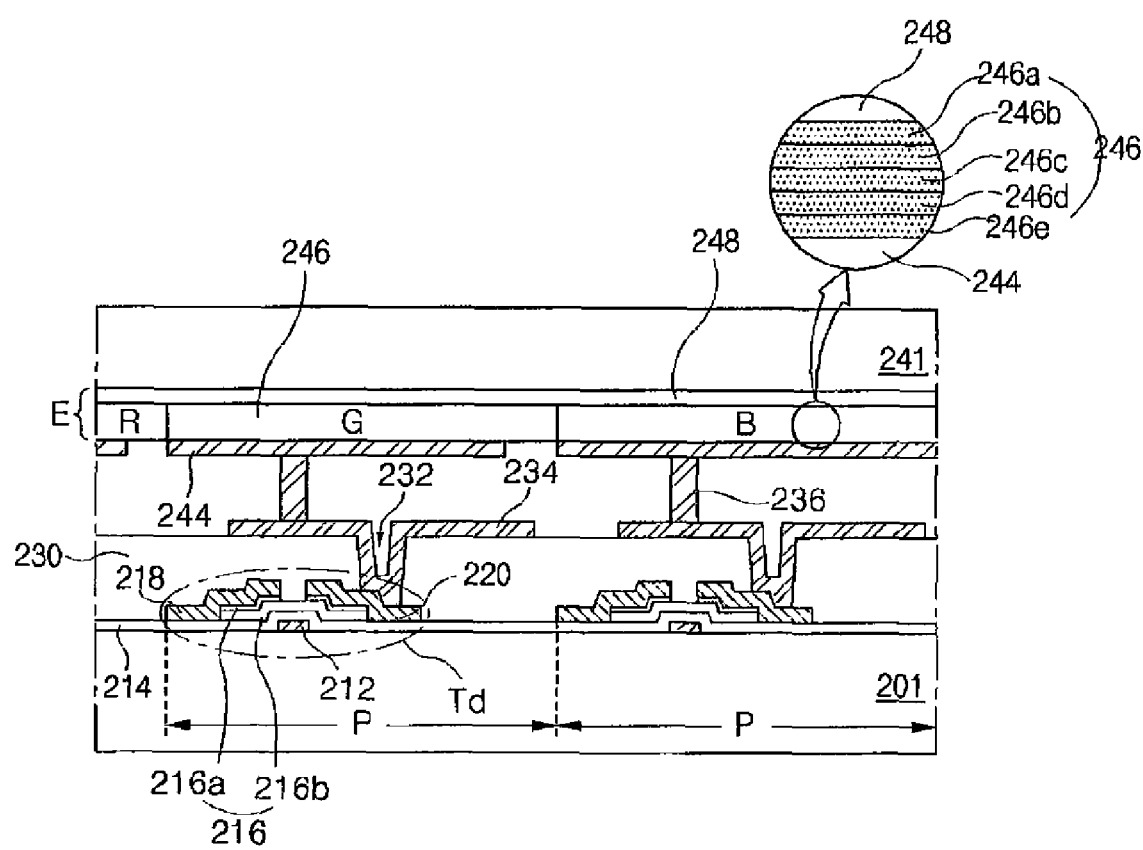
FIG. 15 is a cross-sectional view showing a dual-panel type OELD device having a hole injection layer according to the present invention.

FIG. 15 is a cross-sectional view showing a dual-panel type OELD device having a hole injection layer according to the present invention. In FIG. 15, the dual-panel type OELD device includes first and second substrates 201 and 241 facing each other. A gate line (not shown) and a data line (not shown) are formed on the first substrate 201 and cross each other to define a pixel region P. Moreover, a power line to supply a voltage to an organic electroluminescent diode E is formed on the first substrate 201. A switching element (not shown) and a driving element Td are formed in each pixel region P. The driving element Td includes a gate electrode 212 on the first substrate 201, a gate insulating layer 214 on the gate electrode 212, a semiconductor layer 216 including an active layer 216a and an ohmic contact layer 216b, a source electrode 218 and a drain electrode 220. The gate electrode 212 is connected to a drain electrode of the switching element (not shown). When the switching element (not shown) is opened, a signal voltage is supplied to the gate electrode 212 of the driving element Td through the switching element (not shown).

A passivation layer 230 having a contact hole 232, which exposes a portion of the drain electrode 220 of the driving element Td, is formed on the driving element Td. Although not shown, the source electrode 218 of the driving element Td is connected to the power line (not shown). A connection electrode 234 is formed on the passivation layer 230 to be connected to the drain electrode 220 of the driving element Td through the contact hole 232.

On the other hand, an organic electroluminescent diode E is formed on an inner surface of the second substrate 241, which faces the first substrate 201. The organic electroluminescent diode E includes a first electrode 244, an organic luminescent layer 246 and a second electrode 248. The second electrode 248 is formed on an entire surface of the second substrate 241. The second electrode 248 is formed of a transparent conductive material, such as indium-tin-oxide (ITO) and indium-zinc-oxide (IZO). An organic luminescent layer 246 including a hole injection layer 246a, a hole transporting layer 246b, an emission material layer 246c, an electron transporting layer 246d and an electron injection layer 246e is formed on the second electrode 248 in each pixel region P. The hole injection layer 246a is formed by evaporating and depositing a crystallizable hole injection material and a hole transporting material at the same time. A volumetric ratio of the crystallizable hole injection material to the hole transporting material ranges from approximately 5:1 to 30:1. The crystallizable hole injection material and the hole transporting material are evaporated under different temperature to control the ratio. The hole injection layer 246a has a uniform surface due to the hole transporting material. The crystallizable hole injection material includes one of triphenylene, triphenylamine derivatives, perylene, pyrene, tetracene and anthracene, and the hole transporting material includes an amine group material such as triphenylamine and triphenylamine derivatives. The first electrode 244 is formed on the organic luminescent layer 246 at each pixel region P. The first electrode 244 may be either a single layer including one of calcium (Ca), aluminum (Al), magnesium (Mg), silver (Ag) and lithium (Li) or a double layer including fluorolithium and aluminum (LiF/Al). The first electrode 244 functions as a cathode to emit electrons, and the second electrode 248 functions as an anode to emit holes. Light emitted from the organic luminescent layer 246 passes through the second electrode 248 and the second substrate 241.

A connection pattern 236 to electrically connect the connection electrode 234 of the first substrate 201 and the first electrode 244 of the second substrate 241 is formed on one of the connection electrode 234 of the first substrate 201 and the first electrode 244 of the second substrate 241. When the driving element Td is opened, a voltage of the power line (not shown) is supplied to the first electrode 244 through the driving element Td, the connection electrode 234 and the connection pattern 236 to drive the OELD device.

In the OELD device according to the present invention, a hole injection layer includes not only a crystallizable hole injection material but also a hole transporting material to have a uniform surface. Because light emitted from an organic luminescent layer passes through the hole injection layer having a uniform surface, the OELD device has a uniform brightness. Moreover, because there is no deterioration problem resulted from protruding grains of the conventional hole injection layer, the OELD device according to the present invention has an improved lifetime.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
   first and second substrates facing each other;
   a plurality of gate lines, a plurality of data lines and a plurality of power lines on the first substrate, the gate and data lines crossing each other to define a plurality of pixel regions;
   a switching element and a driving element connected to each other in each pixel region;
   a first electrode connected to the driving element;
   an organic luminescent layer on the first electrode, the organic luminescent layer including,
      a hole injection layer,
      a hole transporting layer,
      an emission material layer,
      an electron transporting layer, and
      an electron injection layer in order,
   wherein the hole injection layer includes a crystallizable hole injection material and a hole transporting material, and the hole transporting layer includes the hole transporting material,
   wherein a volumetric ratio of the crystallizable hole injection material to the hole transporting material in the entire hole injection layer ranges from 5:1 to 30:1 to prevent over-crystallizing of the hole injection layer such that the hole injection layer has a more even surface than a hole injection layer which does not have the hole transporting material, and wherein the hole injection layer is in direct contact with the first electrode and the hole transporting layer; and
   a second electrode on the organic luminescent layer.

2. The device according to claim 1, wherein the crystallizable hole injection material includes one of triphenylene, triphenylamine derivatives, perylene, pyrene, tetracene and anthracene.

3. The device according to claim 1, wherein the hole transporting material includes triphenylamine and triphenylamine derivatives.

4. The device according to claim 1, wherein the hole injection layer contacts the first electrode.

5. The device according to claim 4, wherein the first electrode includes one of indium-tin-oxide and indium-zinc-oxide.

6. The device according to claim 4, wherein the second electrode is an opaque single layer including either one of calcium, aluminum, magnesium, silver and lithium or an opaque double layer having fluorolithium and aluminum.

7. The device according to claim 4, further comprising a moisture absorbent on the second substrate.

8. The device according to claim 1, wherein the electron injection layer contacts the first electrode.

9. The device according to claim 8, wherein the second electrode includes one of indium-tin-oxide and indium-zinc-oxide.

10. The device according to claim 8, wherein the first electrode is an opaque single layer including either one of calcium, aluminum, magnesium, silver and lithium or an opaque double layer having fluorolithium and aluminum.

11. The device according to claim 8, further comprising a connecting pattern between the driving element and the first electrode, wherein the first electrode is connected to the driving element through the connecting pattern.

12. A method of fabricating an organic electroluminescent diode for an organic electroluminescent display device, comprising;
    forming a first electrode having a first work function;
    forming a hole injection layer on the first electrode, the hole injection layer including a crystallizable hole injection material and a hole transporting material;
    forming a hole transporting layer on the hole injection layer, the hole transporting layer including transporting material;
    forming an emission material layer on the hole transporting layer;
    forming an electron transporting layer on the emission material layer;
    forming an electron injection layer on the electron transporting layer; and
    forming a second electrode on the electron injection layer, the second electrode having a second work function smaller than the first work function,
    wherein a volumetric ratio of the crystallizable hole injection material to the hole transporting material in the entire hole injection layer ranges from 5:1 to 30:1 to prevent over-crystallizing of the hole injection layer such that the hole injection layer has a more even surface than a hole injection layer which does not have the hole transporting material, and wherein the hole injection layer is in direct contact with the first electrode and the hole transporting layer.

13. The method according to claim 12, wherein the step of forming the hole injection layer includes depositing the crystallizable hole injection material by heating a crystallizable hole injection material source at a first temperature and depositing the hole transporting material by heating a hole transporting material source at a second temperature.

14. The method according to claim 13, wherein the first temperature is greater than the second temperature.

15. The method according to claim 13, wherein a volumetric ratio of the crystallizable hole injection material to the hole transporting material in the hole injection layer is controlled by difference between the first and second temperatures.

16. A method of fabricating an organic electroluminescent diode for an organic electroluminescent display device, comprising;
    forming a first electrode having a first work function;
    forming an electron injection layer on the first electrode;
    forming an electron transporting layer on the electron injection layer;
    forming an emission material layer on the electron transporting layer;
    forming a hole transporting layer on the emission material layer, the hole transporting layer including a hole transporting material;
    forming a hole injection layer on the hole transporting layer, the hole injection layer including a crystallizable hole injection material and the hole transporting material; and
    forming a second electrode on the hole injection layer, the second electrode having a second work function larger than the first work function,
    wherein a volumetric ratio of the crystallizable hole injection material to the hole transporting material in the entire hole injection layer ranges from 5:1 to 30:1 to prevent over-crystallizing of the hole injection layer such that the hole injection layer has a more even surface than a hole injection layer which does not have the hole transporting material, and wherein the hole injection layer is in direct contact with the second electrode and the hole transporting layer.

17. The method according to claim 16, wherein the step of forming the hole injection layer includes depositing the crystallizable hole injection material by heating a crystallizable hole injection material source at a first temperature and depositing the hole transporting material by heating a hole transporting material source at a second temperature, wherein the first temperature is greater than the second temperature.

* * * * *